US008786339B2

(12) United States Patent
Ma

(10) Patent No.: US 8,786,339 B2
(45) Date of Patent: Jul. 22, 2014

(54) APPARATUSES AND METHODS FOR DELAYING SIGNALS USING A DELAY LINE WITH HOMOGENOUS ARCHITECTURE AND INTEGRATED MEASURE INITIALIZATION CIRCUITRY

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/692,666

(22) Filed: Dec. 3, 2012

(65) Prior Publication Data

US 2014/0152365 A1 Jun. 5, 2014

(51) Int. Cl.
*H03L 7/06* (2006.01)
(52) U.S. Cl.
USPC .......................................... 327/158; 327/149
(58) Field of Classification Search
None
See application file for complete search history.

(56) References Cited

U.S. PATENT DOCUMENTS

| 6,847,246 | B1 | 1/2005 | Kaviani et al. | |
|---|---|---|---|---|
| 7,486,125 | B2 | 2/2009 | Chae | |
| 7,626,435 | B2 | 12/2009 | Haugestuen | |
| 7,982,517 | B2 | 7/2011 | Kim | |
| 8,049,543 | B2 * | 11/2011 | Kang et al. | 327/158 |
| 2007/0030045 | A1 * | 2/2007 | Takai et al. | 327/263 |

* cited by examiner

*Primary Examiner* — Cassandra Cox
(74) *Attorney, Agent, or Firm* — Dorsey & Whitney LLP

(57) ABSTRACT

Apparatuses and methods for delaying signals using a delay line are described. An example apparatus includes a controller configured to in a first mode, set a delay length, and, in a second mode, to determine an initial delay. The apparatus further including a delay line circuit coupled to the controller and includes delay elements. Each of the delay elements includes delay gates that are the same type of delay gate. The delay line circuit is configured to, in the first mode propagate a signal through one or more of the delay elements to provide a delayed signal. The delay line circuit is further configured to, in the second mode, propagate a pulse signal through one or more of the delay elements and provide a corresponding output signal from each of the one or more delay elements responsive to the pulse signal reaching an output of the corresponding delay element.

20 Claims, 5 Drawing Sheets

APPARATUSES AND METHODS FOR DELAYING SIGNALS USING A DELAY LINE WITH HOMOGENOUS ARCHITECTURE AND INTEGRATED MEASURE INITIALIZATION CIRCUITRY

TECHNICAL FIELD

Embodiments of the invention relate generally to delay circuits, and more particularly, in one or more of the illustrated embodiments, to variable delay circuits for adjusting the timing of signals.

DESCRIPTION OF RELATED ART

Variable delay circuits are designed to delay a signal by a delay, for example, often to synchronize two clock signals. Conventional delay circuits have a series of delay elements that are coupled together serially with exit tree circuitry configured to tap an output of any particular delay element once a desired delay length is achieved. The exit tree circuitry includes several layers of circuit elements including circuit elements of different types. The several layers of circuit elements increase forward path delay through which a signal propagates prior to being output, and using different types of circuit elements, decrease the predictability of the delay. Additionally, the exit tree circuitry consumes power and can be particularly susceptible to negative bias temperature instability (NBTI) degradation and duty cycle distortion issues. Further, circuitry for the exit tree logic increases a layout area required for the delay circuit.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
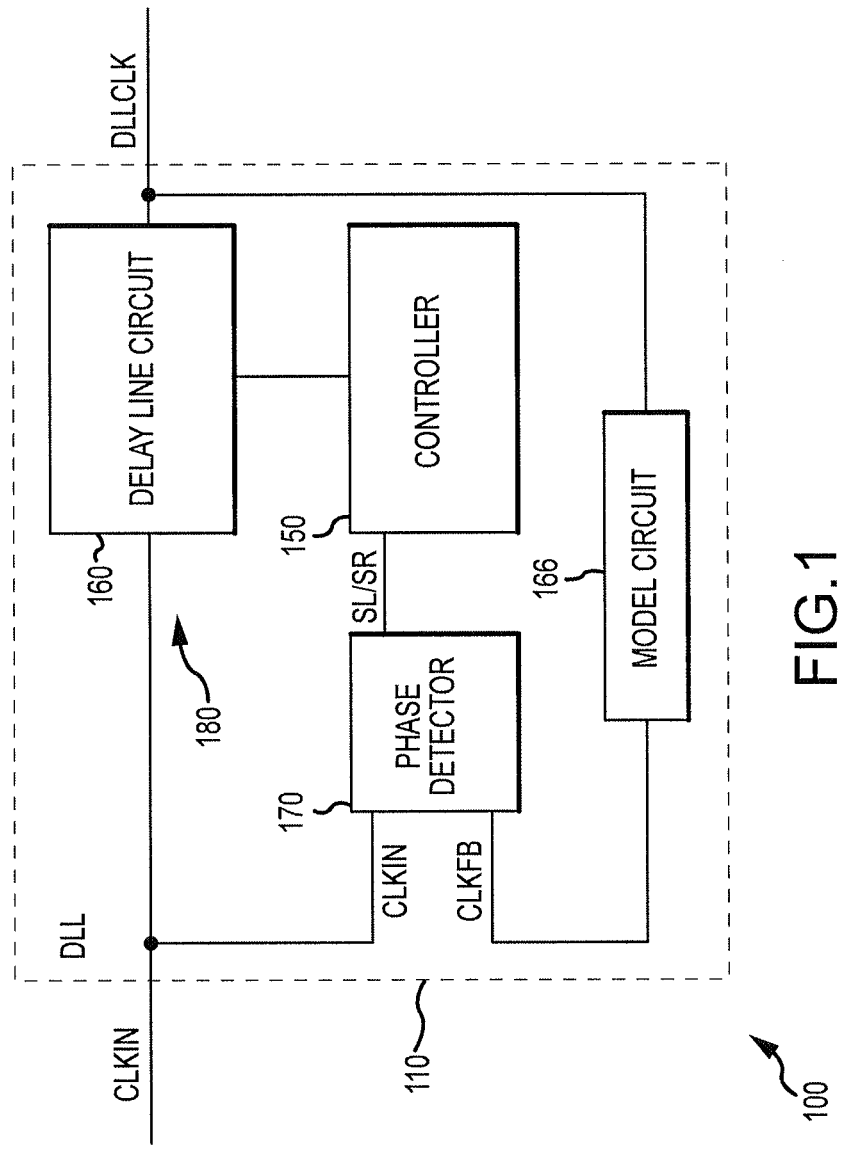
FIG. 1 is a block diagram of a particular illustrative embodiment of an apparatus including a delay-locked loop.

Referring to FIG. 1, a particular illustrative embodiment of an apparatus including a delay-locked loop (DLL) is disclosed and generally designated 100. As used herein, examples of apparatuses may include an integrated circuit, a memory device, a memory system, an electronic device or system, a smart phone, a tablet, a computer, a server, etc. The apparatus 100 may include a DLL circuit 110, which includes a delay line circuit 160. The delay line circuit 160 includes a plurality of delay elements coupled together. Each of the plurality of delay elements may be nearly identical and may delay a signal for an approximately equal length of time. The delay line circuit 160 may include a delay line circuit with homogenous architecture and integrated measurement initialization circuitry. A delay line circuit with homogenous architecture may include delay gates of a same type. Further, the integrated measure initialization circuitry may include circuitry integrated into the delay line circuit that is capable of performing a measure initialization operation to determine an initial delay. The apparatus 100 may receive an input signal CLKIN and provide a DLL signal DLLCLK by delaying the CLKIN signal through the delay line circuit 160. The delay of the delay line circuit 160 may be adjusted based on a comparison between a phase of a feedback signal CLKFB (e.g., the DLLCLK delayed by a model circuit 166) and a phase of the CLKIN signal at a phase detector 170. The phase detector 170 provides shift signals SL/SR to a controller 150 that are indicative of a difference between the phases of the CLKFB and CLKIN signals. Responsive to the SL/SR signals, the controller 150 provides control signals to control the delay of the delay line circuit 160. The controller 150 may include a shift register that is used to provide the control signals to control the length of the delay through the delay line circuit 160 based on the SL/SR signals. In an embodiment, the controller 150 provides control signals that cause the number of active delay elements to decrease responsive to an active SL signal (e.g., "shift left"), and as a result, decrease the delay of the delay line circuit 160. The controller 150 may provide control signals that cause the number of active delay elements to increase responsive to an active SR signal (e.g., "shift right"), and as a result, increase the delay of the delay line circuit 160.

The DLLCLK signal is provided to a model circuit 166, which provides a further delay to the DLLCLK signal to provide the CLKFB signal. The model circuit 166 may model a propagation delay of at least a portion of the circuitry (not shown) of the apparatus 100, for example, an output or an input buffer, a signal distribution network, or other circuit.

In operation, the DLL circuit 110 may be configured to operate in one of at least two modes. A first mode may be a measure initialization mode and a second mode may be a tracking mode. In the measure initialization mode, a measure operation may be performed during which the controller 150 may determine an initial delay length based on a pulse signal propagating through the delay line circuit 160. During measure initialization mode, a signal is propagated through the DLL circuit 110 contemporaneously with a pulse signal propagating through the delay line circuit 160. As the pulse signal propagates through the delay line circuit 160, the plurality of delay elements are each configured to provide an output signal responsive to the pulse signal reaching an output of a corresponding delay element. Responsive to the signal completing propagation through the DLL circuit 110, the controller 150 may determine an initial delay based on the output signals received from the delay line circuit 160. In an embodiment, the controller 150 may count a number of output signals that were asserted based on the phase difference between feedback pulse signal and reference clock. In another embodiment, the controller 150 may determine a delay element associated with a last asserted output signal that was received. The controller 150 may store a value associated with an initial delay in a shift register based on the output signals received. After determining and setting the initial delay, the DLL circuit 110 may exit the measure initialization mode.

During the tracking mode, the controller 150 configures the delay line circuit 160 to delay the CLKIN signal to achieve a desired delay length to produce the DLLCLK signal based on a phase relationship between the CLKIN signal and the CLKFB signal. For example, the phase detector 170 is configured to monitor a phase relationship between the CLKIN signal and the CLKFB signal by detecting a phase difference between the CLKIN signal and the CLKFB signal (e.g., the DLLCLK signal delayed through the model circuit 166). Based on a detected phase difference, the phase detector 170 may provide the SL/SR signals having a value indicating a shift necessary to attempt to reduce the phase difference. The detection of a phase difference and providing of the SL/SR signal continues to synchronize (e.g., in phase with each other) the CLKIN and the CLKFB signals. In an embodiment, the SL/SR signal may include a shift right (SR) signal and/or a shift left (SL) signal. In other embodiments, signals other than shift signals may be provided by the phase detector 170 to indicate a phase difference between the CLKIN and CLKFB signals.

The controller 150 may provide control signals responsive to the SL/SR signals to adjust the length of the delay applied to the CLKIN signal by delay line circuit 160. For example, when shifting to the left, the controller 150 controls the delay line circuit to have fewer active delay elements of the plurality of delay elements in the delay line circuit 160, to decrease the length of the delay applied to the CLKIN signal. Alternatively, when shifting to the right, the controller 150 controls the delay line circuit to have more active delay elements of the plurality of delay elements in the delay line circuit 160 to increase the length of the delay applied to the CLKIN signal. By adjusting the length of the delay through the delay line circuit 160 applied to the CLKIN signal, the CLKFB signal is adjusted accordingly. The controller 150 may perform further fine tuning by mixing signals (not shown) generated within the delay line circuit 160 prior to providing the DLLCLK signal. When the CLKIN and CLKFB signals are synchronized, the phase detector 170 may provide SL/SR signals that maintain the length of the delay through the delay line circuit 160 and set the DLL circuit 110 in locked position.

A delay line circuit with homogenous architecture and integrated measure initialization circuitry may simplify the delay line circuit 160, as compared with a delay line having exit trees and separate measure initialization circuitry. Elimination of an exit tree from the delay line circuit 160 may reduce a forward path delay, layout area, and power consumption. Additionally, negative bias temperature instability (NBTI) degradation may be mitigated by eliminating the exit tree. Further, circuitry integrated for the measure initialization mode may reduce necessary circuitry of the delay line circuit 160, which may reduce layout area and power consumption. Using homogenous delay elements may increase accuracy and reliability of a delay length due to each of the delay gates having a equal delay length. Further, responsive to exposure to similar operational stresses (e.g., temperature changes, etc.), the homogenous delay elements of the delay line circuit 160 may all degrade in a similar manner. For example, a variance in delay length caused by operational stresses may be approximately equal on of the homogenous delay elements.

Figure 2:
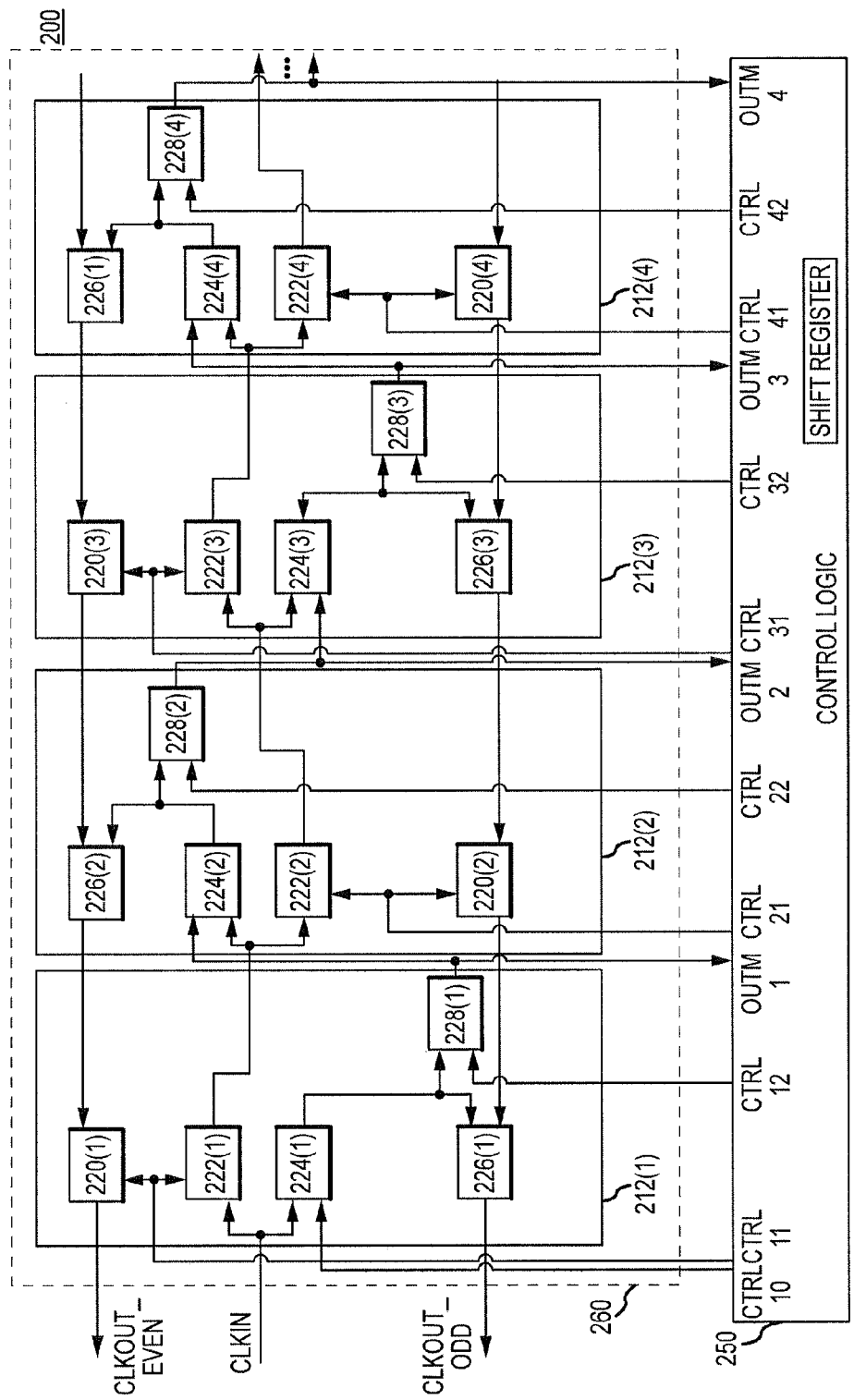
FIG. 2 is a block diagram of a particular illustrative embodiment of an apparatus including a homogenous delay line circuit.

Referring to FIG. 2, a particular illustrative embodiment of an apparatus including a delay line circuit with homogenous architecture and integrated measurement initialization circuitry is disclosed and generally designated 200. The apparatus 200 may include a delay line circuit 260 having a plurality of delay elements 212(1-N) configured to be controlled by a controller 250. While FIG. 2. depicts four delay elements 212(1-4), one of ordinary skill in the art would recognize that the delay line circuit 260 may be expanded to include any number of delay elements 212(1-N). Each of the plurality of delay elements 212(1-N) may form a delay line circuit 260 with homogenous architecture and integrated measurement initialization circuitry. While in a tracking mode, the first delay element 212(1) of the delay line circuit 260 may be configured to receive an input signal CLKIN and to provide an even output signal CLKOUT-EVEN having a first delay through one or more of the plurality of delay elements 212(1-N). The first delay element 212(1) may be further configured to provide odd output signal CLKOUT-ODD having a second delay through one or more of the plurality of delay elements 212(1-N). A length of the first delay and a length of the second delay may be based on control signals received from the controller 250. Further, the plurality of delay elements 212(1-N) may be used by the controller 250 during the measure initialization mode to determine an initial delay. The controller 250 may include the controller 150 of FIG. 1. The delay line circuit 260 may include the delay line circuit 160 of FIG. 1.

A delay element of the plurality of delay elements 212(1-N) may be coupled to adjacent delay elements of the plurality of delay elements 212(1-N). In an embodiment, the plurality of delay elements 212(1-N) may have the same architecture. Each of the plurality of delay elements 212(1-N) includes a two or more delay gates 220(1-N), 222(1-N), 224(1-N), 226(1-N), and 228(1-N). The two or more delay gates 220(1-N), 222(1-N), 224(1-N), 226(1-N), and 228(1-N) may include a same type of delay gate, and may have approximately equal delay characteristics. For example, the two or more delay gates 220(1-N), 222(1-N), 224(1-N), 226(1-N), and 228(1-N) may delay a signal for an approximately equal length of time. Further, a type of delay gate of each of the corresponding two or more delay gates 220(1-N), 222(1-N), 224(1-N), 226(1-N), and 228(1-N) may include a two-input NAND gate NAND2.

The delay element 212(1) may be configured to receive an input control signal CTRL10, a first control signal CTRL11, and a second control signal CTRL12 from the controller 250, and may be configured to provide an output signal OUTM1 to the controller 250. The delay element 212(2) may be configured to receive a first control signal CTRL21 and a second control signal CTRL22 from the controller 250 and may be configured to provide an output signal OUTM2 to the controller 250. The delay element 212(3) may be configured to receive a first control signal CTRL31 and a second control signal CTRL32 from the controller 250 and may be configured to provide an output signal OUTM3 to the controller 250. The delay element 212(4) may be configured to receive a first control signal CTRL41 and a second control signal CTRL42 from the controller 250 and may be configured to provide an output signal OUTM4 to the controller 250. Similarly, additional delay elements (not shown) may be configured to receive a corresponding first control signal and a corresponding second control signal and to provide the corresponding output signal.

In operation, the controller 250 may control the delay line circuit 260 for the measure initialization mode using the control signals CTRL<1:N><0:2> signals. For example, the controller 250 may control the delay line circuit 260 for the measure initialization mode by asserting the CTRL10 signal and each of the CTRL<1:N>2 signals to provide a signal path through the delay line elements 212(1-N). The signal path may include at least two of the delay gates 222(1-N), 224(1-N), and a delay gate 228(1-N). During the measure initialization mode, a pulse signal is provided as the CLKIN signal to the first delay element 212(1). The pulse signal propagates along the signal path through the delay elements 212(1-N), with the OUTM<1:N> signals sequentially asserted as the pulse signal reaches an output of the corresponding delay gate 228(1-N). Upon completion of the measure initialization, the controller 250 may be configured to determine an initial delay based on the asserted OUTM<1:4> signals (e.g., determining a count of the asserted OUTM<1:N> signals or determining a delay element associated with a last asserted OUTM<1:N> signal) and to store a value indicating the initial delay in a shift register. After setting the initial delay, the measure initialization mode may be exited. A specific example of the measure initialization mode is described further with reference to FIG. 3.

The controller 250 may be configured to control the delay line circuit 260 for the tracking mode using the CTRL<1:N><0:2> signals. During the tracking mode, the controller 250 may be configured to control the delay elements 212(1-N) to provide a first delay applied to the CLKIN signal to produce the CLKOUT-EVEN signal and provide a second delay applied to the CLKIN signal to produce the CLKOUT-ODD signal by asserting the CTRL10 signal and/or at least one of the CTRL<1:N>1 signals. Asserting the CTRL 10 signal and/or the CTRL<1:N>1 signals may set a first signal path for the CLKIN signal to produce the CLKOUT-EVEN signal and may set a second signal path for the CLKIN signal to produce the CLKOUT-ODD signal. For example, the CTRL10 and/or the at least one of the CTRL<1:4>1 signals may be asserted by the controller 250 based on a determination of a number of delay elements to be applied for each of the first delay and the second delay. Each of the first signal path and the second signal path may include at least two of the delay gates 220 (1-N), 222(1-N), 224(1-N), and 226(1-N).

The first signal path may form a loop starting from the CLKIN signal input of the first delay element 212(1) and returning to the CLKOUT-EVEN signal output of the first delay element 212(1). For example, the first signal path may extend through one or more of the plurality of delay elements 212(1-N) to a first return delay element of the plurality of delay elements 212(1-N), and return to the CLKOUT-EVEN signal output of the first delay element 212(1) from the first return delay element. The first return delay element may be designated by the controller 250 by the CTRL10 signal and the CTRL<1:N>1 signals. The second signal path may form a loop starting from the CLKIN signal input of the first delay element 212(1) and returning to the CLKOUT-ODD signal output of the first delay element 212(1). For example, the second signal path may extend through one or more of the plurality of delay elements 212(1-N) to a second return delay element 212(1-N), and return to the CLKOUT-ODD signal output of the first delay element 212(1) from the second return delay element. The second return delay element may be designated by the controller by the CTRL10 signal and the CTRL<1:N>1 signals. A specific example of the delay operation is described further with reference to FIG. 4.

As discussed with reference to FIG. 2, each of the delay elements 212(1-N) include two or more delay gates 220(1-N), 222(1-N), 224(1-N), 226(1-N), and 228(1-N), with each of the two or more delay gates 220(1-N), 222(1-N), 224(1-N), 226(1-N), and 228(1-N) including a same type of gate delay, and having approximately equal delay characteristics, even as operational stresses cause degradation of the two or more delay gates 220(1-N), 222(1-N), 224(1-N), 226(1-N), and 228(1-N) over time. For example, degradation of each of the two or more delay gates 220(1-N), 222(1-N), 224(1-N), 226(1-N), and 228(1-N) may be similar based on having a same type of gate and being exposed to substantially similar operational stresses. This homogenous nature simplifies delay line circuit architecture, and looping signal paths back to a first delay element 212(1) may eliminate a need for a clock tree, which reduces power consumption and layout.

Figure 3:
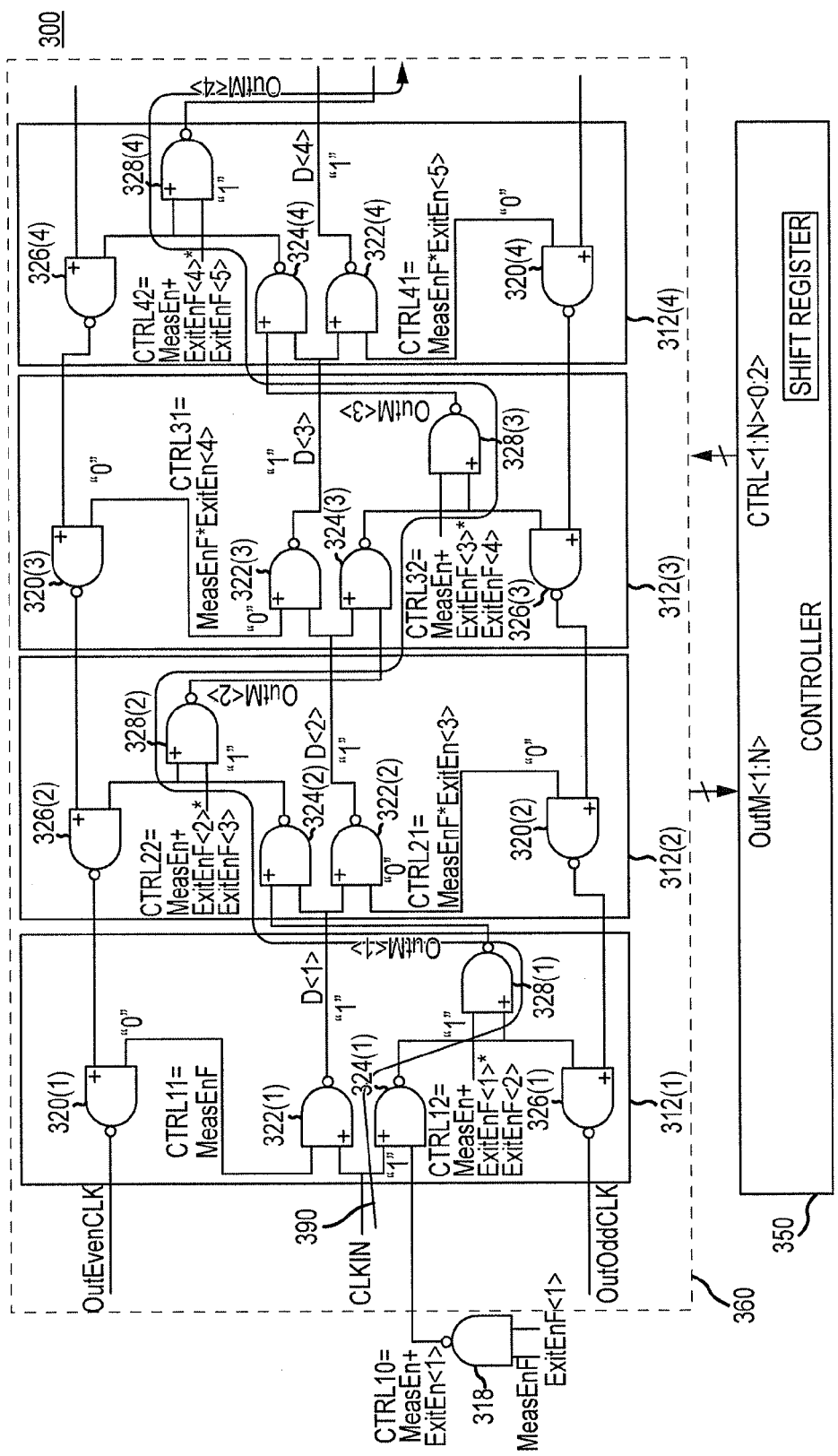
FIG. 3 is a block diagram of a particular illustrative embodiment of an apparatus including a homogenous delay line circuit.

Referring to FIG. 3, a particular illustrative embodiment of an apparatus including a delay line circuit 360 with homogenous architecture and integrated measure initialization circuitry is disclosed and generally designated 300. The apparatus 300 may include a delay line circuit 360 having a plurality of delay elements 312(1-N) configured to be controlled by a controller 350. While FIG. 3. depicts four delay elements 312(1-N), one of ordinary skill in the art would recognize that the delay line circuit 360 may be expanded to include any number of delay elements. Each of the plurality of delay elements 312(1-N) have homogenous architectures and integrated measure initialization circuitry. The delay element 312(1) may receive an input signal CLKIN and may provide an even output signal CLKOUT-EVEN and an odd output signal CLKOUT-ODD each having a delay from propagating through one or more of the delay elements 312(1-N), and/or additional delay elements based on control signals received from the controller 350. Further, the plurality of delay elements 312(1-N) may be used with the controller 350 during the measure initialization mode to determine an initial delay. The controller 350 may include the controller 150 of FIG. 1 and/or the controller 250 of FIG. 2. The delay line circuit 360 may include the delay line circuit 160 of FIG. 1 and/or the delay line circuit 260 of FIG. 2. Each of the "0" and the "1" illustrated in the delay line circuit 360 represent a logical value of a corresponding line or input.

As with the delay elements 212(1-N) of the delay line circuit 260 described with reference to FIG. 2, a delay element of the plurality of delay elements 312(1-N) may be coupled to adjacent delay elements of the plurality of delay elements 312(1-N). Each of the plurality of delay elements includes a corresponding two or more two-input NAND gates NAND2 including corresponding delay gates 320(1-N), 322(1-N), 324(1-N), 326(1-N), and 328(1-N). The two or more delay gates 320(1-N), 322(1-N), 324(1-N), 326(1-N) may be homogenous and may have approximately equal delay characteristics. For example, each of the two or more delay gates may delay a signal for approximately a same length of time.

The delay line circuit 360 may receive control signals CTRL<1:N><0:2> from the controller 350 and provide output signals OUTM<LN> to the controller 350. The CTRL<1:4><0:2> signals may correspond to the CTRL<1:4><0:2> signals described with reference to FIG. 2. The CTRL<1:4><0:2> signals may be based on a measurement enable signal MEASEN and/or corresponding exit enable signals EXITEN<1:N>. The MEASENF signal and the EXITENF<1:N> signals are complements to the MEASEN signal and the EXITEN<1:N> signals, respectively. The MEASEN signal may be asserted during a measure initialization mode.

Each of the EXITEN<1:N> signals may correspond to a respective one of the plurality of delay elements 312(1-N). The controller 350 may be configured to set a delay length of the CLKOUT-EVEN signal or the CLKOUT-ODD signal by asserting the EXITEN<1:N> signal corresponding to a particular delay element of the plurality of delay elements 312(1-N). The asserted EXITEN<1:N> signal is used to assert and/or clear one or more of the CTRL<1:4><0:2> signals associated with the asserted EXITEN<LN> signal. At least one of the EXITEN<1:N> signals may be asserted for each of the CLKOUT-EVEN signal and the CLKOUT-ODD signal during a tracking mode. Logic used to assert each of the CTRL<1:4><0:2> signals provided to the delay line circuit 360 by the controller 350 is depicted as a logic equation at an input of a corresponding NAND2 gate. In the logic equations, the "*" indicates AND logic, and the "+" indicates OR logic. For example, CTRL10 is asserted responsive to MEASEN having a logical high value OR EXITEN<1> having a logical high value. Further, the OUTM<1:N> signals that may correspond to the OUTM<1:N> signals of FIG. 2 and are identified by corresponding text in the delay line circuit 360.

An example of a measure initialization mode is depicted in FIG. 3. Line 390 depicts one example of a signal path through the delay line circuit 360 during the measure initialization mode. During the measure initialization mode, the MEASEN signal is asserted and logic gate 318 provides a logical high value to an input of the delay gate 324(1). The MEASEN signal also enables each of the delay gates 328(1-N) via a corresponding CTRL<1:4>2 signal. A pulse signal is provided to an input of the delay gate 322(1) and the delay gate 324(1), which is to be propagated through the delay elements of the delay line circuit 360. In an embodiment, the pulse signal is represented by a transition from a logical high value to a logical low value. The delay gate 324(1) provides a signal to the delay gate 328(1), and the delay gate 328(1) asserts the OUTM1 signal provided to the controller 350. The OUTM1 signal is also provided to an input of the delay gate 324(2). Responsive to the pulse signal, an output signal D1 is provided by the delay gate 322(1) to a second input of the delay gate 324(2). Based on the OUTM1 signal and the D1 signal, a signal is provided to the delay gate 328(2), and the delay gate 328(2) asserts the OUTM2 signal provided to the controller 350. Propagation of the pulse signal along a path corresponding to the line 390 continues until a feedback loop (not shown) of a DLL, such as the DLL circuit 110 of FIG. 1, has been completed by a reference signal (not shown), as described with reference to FIG. 1. The controller 350 may be configured to determine an initial delay based on asserted OUTM<1:N> signals that are provided as the pulse signal propagates through the delay elements 312, and may store a value corresponding to the initial delay in a shift register. After setting an initial delay, the measure initialization mode may be exited.

Figure 4:
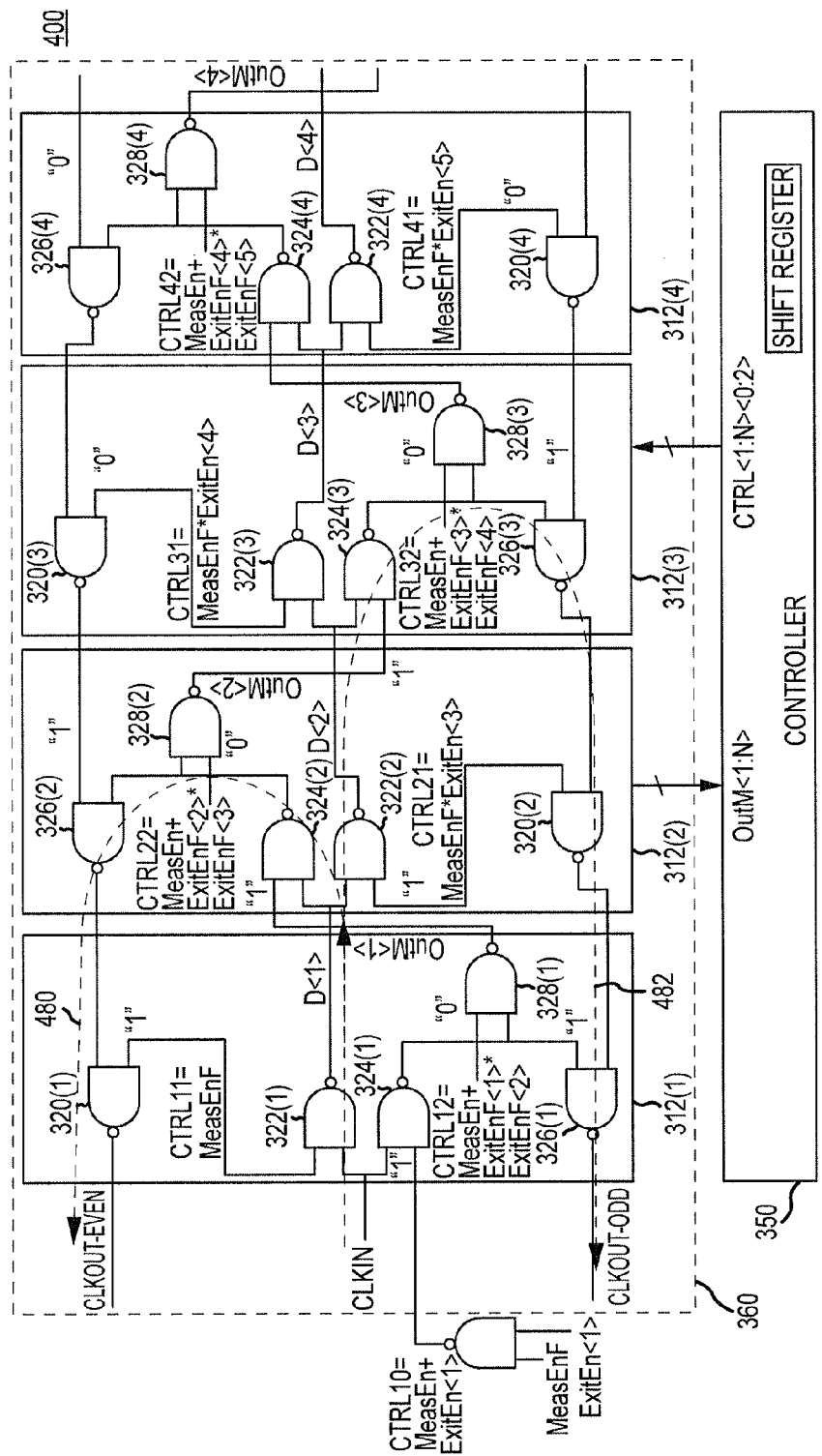
FIG. 4 is a block diagram of a particular illustrative embodiment of an apparatus including a homogenous delay line circuit.

An example operation of the delay line circuit 360 during the tracking mode according to an embodiment of the invention will be described with reference to FIG. 4. Dashed line 480 depicts an example of a first propagation path of the CLKIN signal through the delay line circuit 360 to provide the CLKOUT-EVEN signal during the tracking mode. Dashed line 482 depicts an example of a second propagation path of the CLKIN signal through the delay line circuit 360 to produce the CLKOUT-ODD signal during the tracking mode. In the example depicted in FIG. 4, it is assumed that the desired delay for the CLKOUT-EVEN and CLKOUT ODD signals are provided by having the delay element 312(2) as the first return delay element and the delay element 312(3) as the second return delay element.

During the tracking mode, the MEASEN signal is not asserted. The EXITENF<2> signal is de-asserted (e.g., the complement EXITEN<2> signal is asserted) by the controller 350 to control the delay line circuit 360 to have the delay element 312(2) as the first return delay element. Further, the EXITEN<3> signal is asserted by the controller 350 to control the delay line circuit 360 to have the delay element 312(3) as the second return delay element. Control signals associated with the EXITENF<2> signal and/or the EXITEN<3> signal are asserted or cleared corresponding to the EXITENF<2> signal being de-asserted and/or the EXITEN<3> signal being asserted. Responsive to the EXITENF<2> signal being de-asserted, the CLKIN signal loops back to the CLKOUT-EVEN signal output at the delay element 312(2). Thus, the CLKIN signal propagates through four delay gates 322(1), 324(2), 326(2) and 320(1) to provide the CLKOUT-EVEN signal. Responsive to the EXITEN<3> signal being asserted the CLKIN signal loops back to the CLKOUT-ODD signal output at the delay element 312(2). Thus, the CLKIN signal propagates through six delay gates 322(1), 322(2), 324(3), 326(3), 320(2), and 326(1) to provide the CLKOUT-ODD signal. The difference in delay between the CLKOUT-EVEN signal and the CLKOUT-ODD signal is two delay gates or approximately two times the propagation delay associated with a delay gate. The CLKOUT-EVEN signal and/or the CLKOUT-ODD signal may be further processed or combined (e.g., mixed by a phase mixer circuit) to produce the DLL-OUT signal of FIG. 1.

Figure 5:
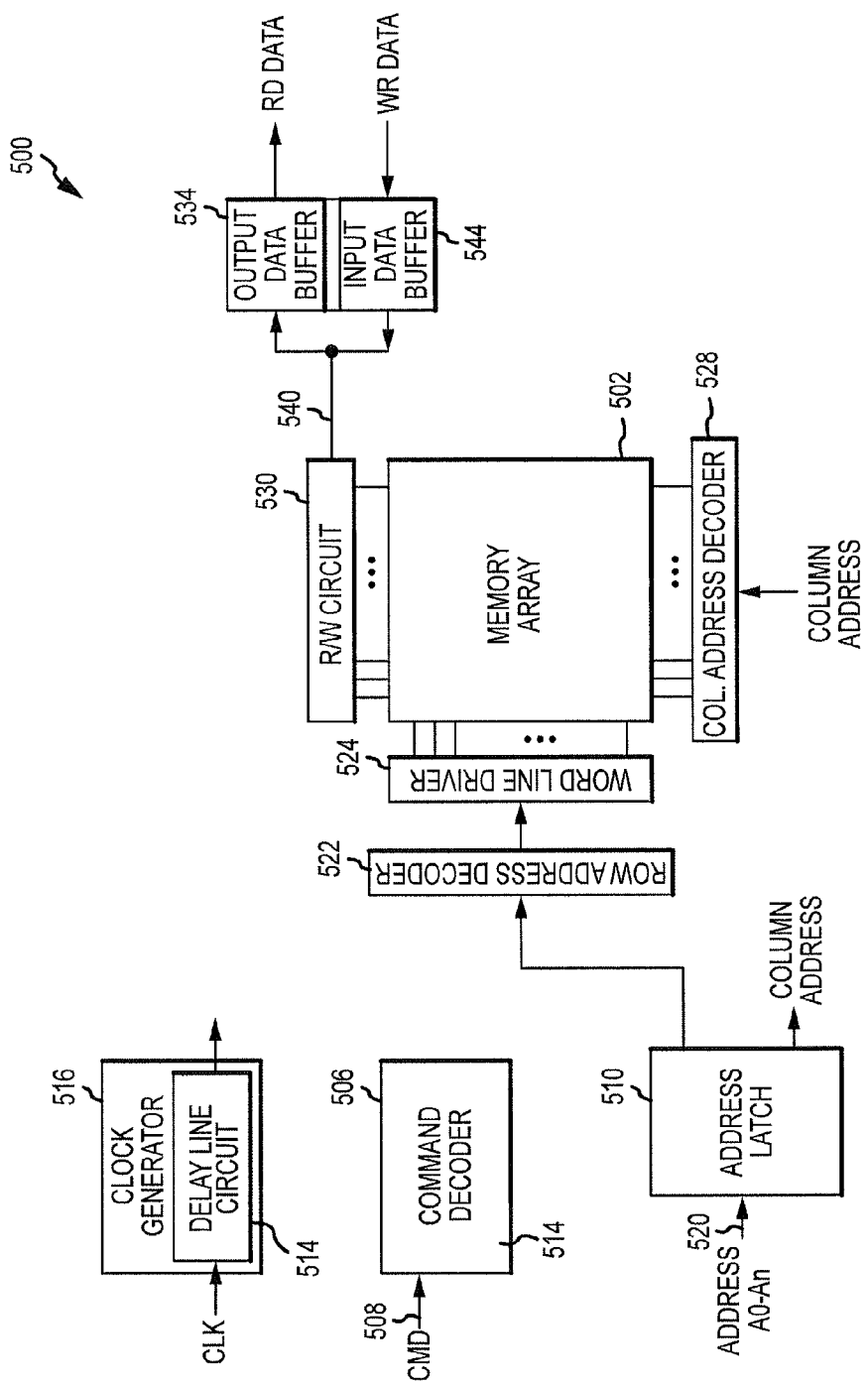
FIG. 5 is a block diagram of a memory including a homogenous delay line circuit according to an embodiment of the invention.

Referring to FIG. 5, block diagram of a memory 500 including a delay line circuit according to an embodiment of the invention. The memory 500 may include an array 502 of memory cells, which may be, for example, dynamic random-access memory (DRAM) memory cells, static random-access memory (SRAM) memory cells, flash memory cells, or some other types of memory cells. The memory 500 includes a command decoder 506 that may receive memory commands through a command bus 508 and provide (e.g., generate) corresponding control signals within the memory 500 to carry out various memory operations. Row and column address signals may be provided (e.g., applied) to an address latch 510 in the memory 500 through an address bus 520. The address latch 510 may then provide (e.g., output) a separate column address and a separate row address.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to a output data buffer 534 via an input-output data bus 540. Write data may be provided to the memory array 502 through a input data buffer 544 and the memory array read/write circuitry 530. The command decoder 506 may respond to memory commands provided to the command bus 508 to perform various operations on the memory array 502. In particular, the command decoder 506 may be used to provide internal control signals to read data from and write data to the memory array 502.

The memory 500 may include a clock generator 516 that includes a delay line circuit 514 with homogenous architecture and integrated measure initialization circuitry 514. The delay line circuit 514 provides a DLLCLK signal that may be used for clocking circuitry of the memory 500. The delay line circuit 514 may include the delay line circuit 160 of FIG. 1 and/or the delay line circuit 260 of FIG. 2, the delay line circuit 360 of FIGS. 3 and 4, or any combination thereof, and may be configured to operate in conjunction with the controller 150 of FIG. 1 and/or the controller 250 of FIG. 2, the controller 350 of FIGS. 3 and 4. For example, the delay line circuit 514 may be configured, in the first mode, to drive a clock signal through one or more of a plurality of delay elements to provide a delayed clock signal at an output. The delay line circuit 514 may be further configured to, in the second mode, based on the control signals, receive a pulse signal and provide a corresponding output signal from each of the plurality of delay elements responsive to the pulse signal reaching an output of the corresponding delay element, for example, to set an initial delay for the delay line circuit 514.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a controller configured to:
in a first mode, set a delay length; and
in a second mode, determine an initial delay; and
a delay line circuit coupled to the controller, the delay line circuit including a plurality of delay elements, wherein each of the plurality of delay elements includes two or more delay gates that are the same type of delay gate, the delay line circuit configured to:
in the first mode, propagate a signal through one or more of the plurality of delay elements to provide a delayed signal at an output; and
in the second mode, propagate a pulse signal through one or more of the plurality of delay elements and provide a corresponding output signal from each of the one or more of the plurality of delay elements responsive to the pulse signal reaching an output of the corresponding delay element.

2. The apparatus of claim 1, wherein, in the first mode, the plurality of delay elements are configured to propagate the signal through the one or more of the plurality of delay elements along a signal path to provide the delayed signal.

3. The apparatus of claim 2, wherein the signal path begins at a first delay element of the plurality of delay elements and loops back through the first delay element.

4. The apparatus of claim 3, wherein signal path loops back at a return delay element of the plurality of delay elements.

5. The apparatus of claim 2, wherein the signal path is a first signal path, and in the first mode, the plurality of delay elements are further configured to contemporaneously propagate the signal along a second signal path to provide a second delayed signal, wherein the second signal path includes at least one of the plurality of delay elements.

6. The apparatus of claim 2, wherein the first signal path is different from the second signal path.

7. The apparatus of claim 5, wherein the first signal path includes a first number of delay elements of the plurality of delay elements and the second signal path includes a second number of delay elements of the plurality of delay elements, wherein the first number of delay elements is different than the second number of delay elements.

8. The apparatus of claim 7, wherein the first number is an even number of delay elements of the plurality of delay elements and wherein the second number is an odd number of delay elements of the plurality of delay element.

9. The apparatus of claim 1, wherein, in the second mode, the plurality of delay elements are configured to propagate the pulse signal through the one or more of the plurality of delay elements along a signal path sequentially through each of the one or more of the plurality of delay elements.

10. The apparatus of claim 9, wherein the signal path includes at least two delay gates from each of the one or more of the plurality of delay elements.

11. A method, comprising:
configuring a delay line circuit of a delay-locked loop to a first configuration during a first mode;
in the first mode:
propagating a signal along a first signal path through one or more of a plurality of delay elements of the delay line circuit, wherein each of the plurality of delay elements includes a corresponding two or more delay gates, wherein each of the two or more delay gates are the same type of delay gate; and
providing a delayed signal from the delay line circuit;
configuring the delay line circuit to a second configuration during a second mode; and
in the second mode:
propagating a pulse signal along a second signal path through one or more of the plurality of delay elements;
providing a corresponding asserted output signal from one or more of the plurality of delay elements responsive to the pulse signal reaching an output of the corresponding delay element; and
determining an initial delay based on a the asserted output signals.

12. The method of claim 11, wherein, the signal path forms a loop starting at an input of a first delay element of the one or more of the plurality of delay elements and ending at an output of the first delay element.

13. The method of claim 12, further comprising, in the first mode, adjusting the delay length to adjust a delay of the delayed signal relative to the signal.

14. The method of claim 11, further comprising, in the second mode, setting a value in a shift register corresponding to the initial delay.

15. The method of claim 11, wherein, in the second mode, determining the initial delay comprises counting a number of asserted output signals.

16. The method of claim 11, wherein, in the second mode, determining the initial delay comprises determining a particular delay element associated with the asserted output signal that was received last.

17. A method, comprising:
configuring a first delay element and a second delay element to a first configuration during a first mode;
in the first mode:
receiving a signal at a first delay gate the first delay element;
providing the signal from the first delay gate of the first delay element through a first delay gate and a second delay gate of the second delay element to a second delay gate of the first delay element; and
outputting a delayed signal from the second delay gate of the first delay element based on the signal received at the second delay gate of the first delay element, wherein the first delay gate and the second delay gate of the first delay element and the first delay gate and the second delay gate of the second delay element include a same delay gate type;

configuring the first delay element and the second delay element to operate in a second mode based on the control signals having a second configuration; and in the second mode:

providing a pulse signal from a third delay gate of the first delay element to a fourth delay gate of the first delay element and to a third delay gate of a second delay element;

outputting a first output signal from the fourth delay gate of the first delay element to a controller and to the third delay gate of the second delay element; and outputting a second output signal from the fourth delay gate of the second delay element to the controller, wherein the controller determines an initial delay based on the first output signal and the second output signal.

18. The method of claim 17, wherein the first delay gate, the second delay gate, the third delay gate, and the fourth delay gate of the first delay element are each two-input NAND gates, and wherein the first delay gate, the second delay gate, the third delay gate, and the fourth delay gate of the second delay element are each two-input NAND gates.

19. The method of claim 17, further comprising, in the second mode, receiving the pulse signal at the third delay gate of the first delay element.

20. The method of claim 17, further comprising exiting the second mode responsive to setting the initial delay.

* * * * *

UNITED STATES PATENT AND TRADEMARK OFFICE
CERTIFICATE OF CORRECTION

PATENT NO. : 8,786,339 B2
APPLICATION NO. : 13/692666
DATED : July 22, 2014
INVENTOR(S) : Yantao Ma Page 1 of 1

It is certified that error appears in the above-identified patent and that said Letters Patent is hereby corrected as shown below:

In the Claims

In column 10, line 35, in Claim 11, delete "a the" and insert -- the --, therefor.

Signed and Sealed this
Thirteenth Day of January, 2015

Michelle K. Lee
*Deputy Director of the United States Patent and Trademark Office*